United States Patent [19]
Muraoka

[11] Patent Number: 4,999,775
[45] Date of Patent: Mar. 12, 1991

[54] POWER APPARATUS FOR DIAGNOSING AIR BAG EQUIPMENT

[75] Inventor: Kunihiko Muraoka, Tokyo, Japan

[73] Assignee: Fuji Jukogyo Kabushiki Kaisha, Tokyo, Japan

[21] Appl. No.: 346,535

[22] Filed: May 2, 1989

[30] Foreign Application Priority Data

May 11, 1988 [JP] Japan ................................. 63-62451

[51] Int. Cl.$^5$ ............................................. B60R 21/32
[52] U.S. Cl. ............................. 364/424.03; 280/735; 180/271; 307/10.1; 340/436
[58] Field of Search .................. 364/424.03, 424.05; 180/232, 271, 282; 280/728, 734, 735; 307/10.6, 10.7, 10.1; 340/436, 438

[56] References Cited

U.S. PATENT DOCUMENTS

| | | | |
|---|---|---|---|
| 3,931,527 | 1/1976 | Oishi et al. | 307/10.6 |
| 4,222,030 | 9/1980 | Yasui et al. | 280/735 |
| 4,287,431 | 9/1981 | Yasui et al. | 280/735 |
| 4,359,715 | 11/1982 | Langer et al. | 180/271 |
| 4,438,424 | 3/1984 | Yasui | 280/735 |
| 4,695,075 | 9/1987 | Kamiji et al. | 280/735 |
| 4,740,741 | 4/1988 | Andres et al. | 280/735 |
| 4,851,705 | 7/1989 | Musser et al. | 280/735 |
| 4,864,202 | 9/1989 | Nitschke et al. | 280/735 |

Primary Examiner—Gary Chin
Attorney, Agent, or Firm—Beveridge, DeGrandi & Weilacher

[57] ABSTRACT

There is disclosed a power apparatus for diagnosing on air bag equipment, which includes a central processing unit (CPU) having a clock circuit and diagnoses errors and faults occurring in the air bag equipment in order to detect and store error postion, time and condition occurred. The power apparatus comprises a battery circuit for directly connecting a battery and the CPU in order to supply with power of the CPU, an ignition switch circuit for supplying the CPU with the power through an ignition switch, and a changeover control unit for changing a power line in the manner of supplying the CPU with the power through the ignition switch circuit when the engine starts for the first time after delivery, and for supplying the CPU with the power through the battery circuit after failure occurs.

11 Claims, 6 Drawing Sheets

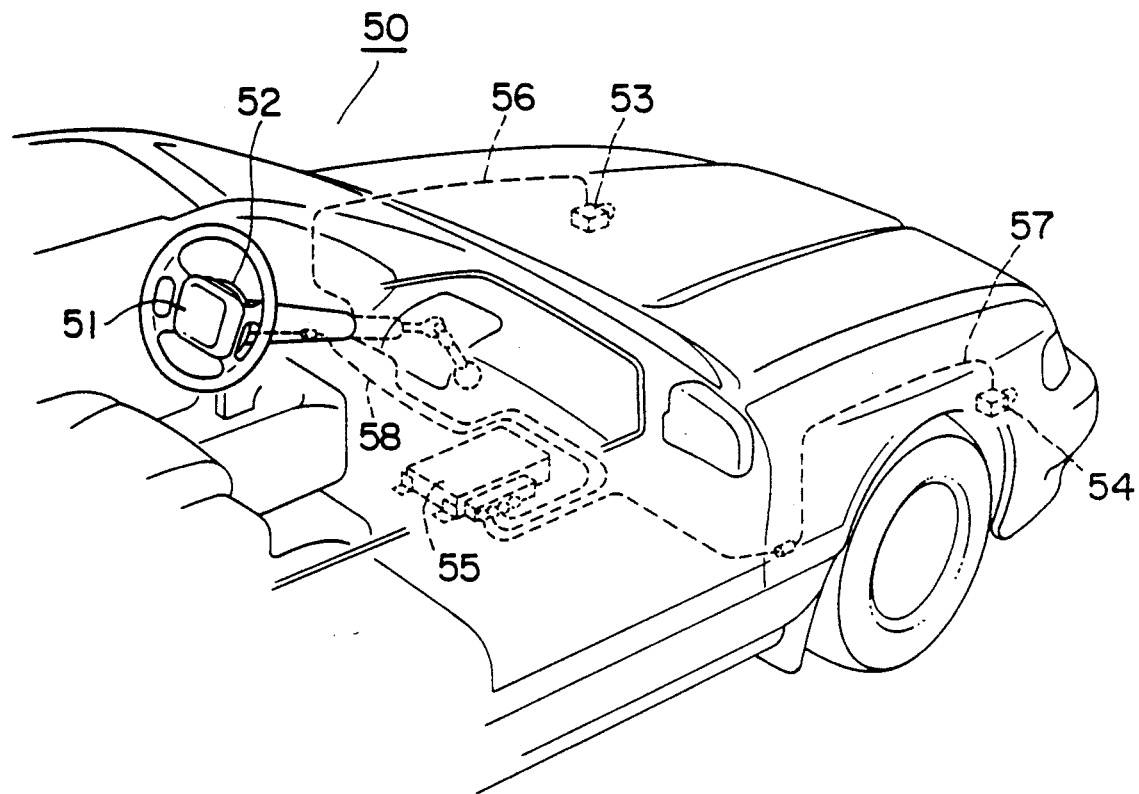
FIG. IA PRIOR ART
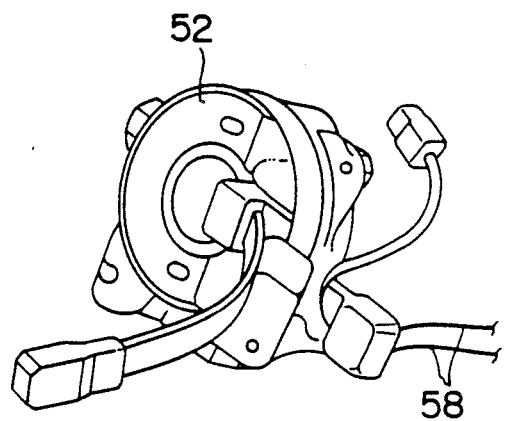
FIG. IB PRIOR ART

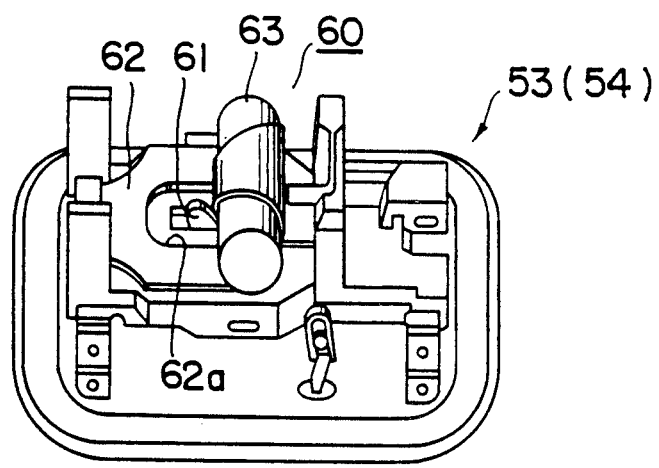
FIG. IC PRIOR ART
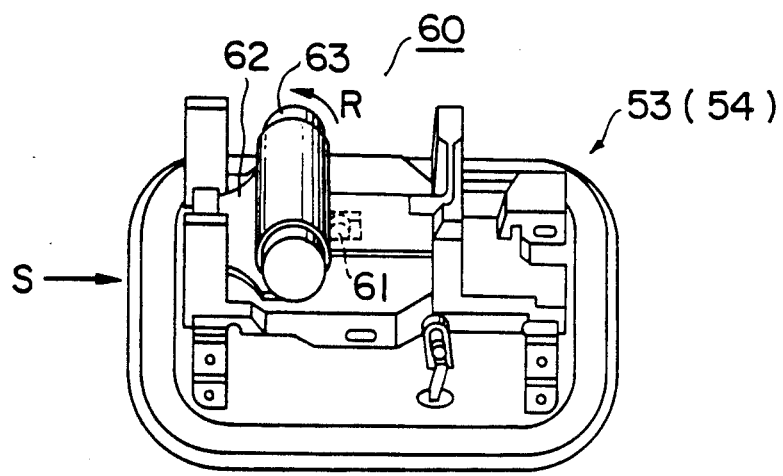
FIG. ID PRIOR ART
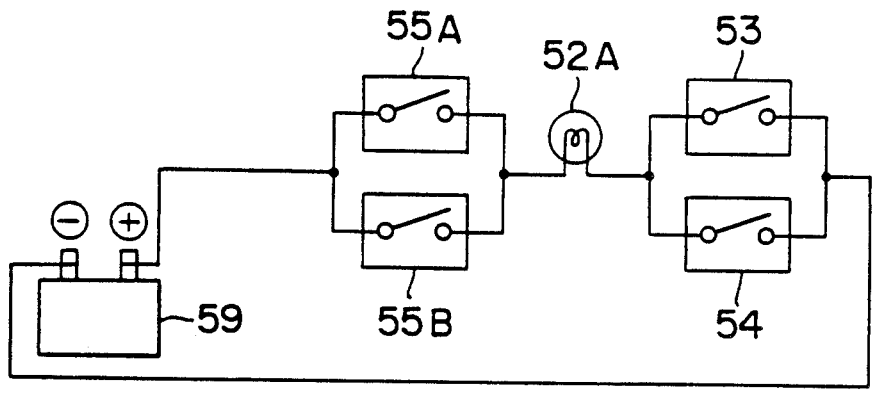
FIG. IE PRIOR ART

POWER APPARATUS FOR DIAGNOSING AIR BAG EQUIPMENT

BACKGROUND OF THE INVENTION

The present invention relates to an apparatus for diagnosing an air bag equipment, and more particularly to an apparatus for the diagnosis apparatus in which a central processing unit (designated as a CPU hereinafter) provided therein includes a timer circuit.

There have been proposed many kinds of air bag equipment for safety, which are mounted in front of a driver and passengers in a motor vehicle. The air bag equipment is a safety equipment which is capable of protecting persons from impact forces when the vehicle collides, in the manner that an ignition of an squib causes high pressure gas to momentarily expand and fill the bag in front of the persons so that the inflated air bags protect them.

FIGS. 1A to 1E show one example of the air bag equipment. An air bag equipment 50 comprises, as shown in FIGS. 1A and 1B, an air bag 51 provided in a vicinity of a steering mechanism in the vehicle. An inflater 52 is attached to the air bag 51 and generates an inert gas such as a nitrogenous gas when the vehicle is subjected to impact forces due to a collision. A pair of compartment sensors 53 and 54 are provided on both front sides of the vehicle and detect strong impact forces of approximately 12G from front direction to expand the air bag 51. A diagnosis control unit 55 and the compartment sensors 53 and 54 are connected by wirings 56 and 57 provided in the vehicle. The unit 55 is connected to the inflater 52 by a wiring 58 to output a gas generate command. The control unit 55 provides a signal to actuate the inflater 52 by strong impact force of approximately 2G from the front direction.

The compartment sensors 53 and 54 described above, as shown in FIGS. 1C and 1D, are provided in cases (not shown) filled with inert gas. A main body 60 of the sensor 53 or 54 comprises a switch 61 provided on a base, a rolled plate spring 62 which has a notch 62a causing the switch 61 to be exposed. Both ends of the plate are fixed to the base, and a center portion of the plate is rolled around a roller 63. The main body 60 operates in the manner that the roller 63 rotates in the direction indicated by the arrow R in FIG. 1D to make the switch 61 turn on when the vehicle receives a strong impact force S from the front direction.

The sensors 53 and 54 mentioned above, as shown in FIG. 1E, are connected in the manner that a heater 52A of the inflater 52 is connected to both of the compartment sensors 53 and 54 and switches 55A and 55B in the diagnosis control unit 55. And the sensors 53 and 54 are connected a negative electrode of a battery 59, and the switches 55A and 55B are connected to a positive electrode of the battery 59.

The air bag equipment has sensors for detecting collision impact forces or the like, a squib to expand the air bag must have high reliability without the occurrence of fault or failure.

That is, in the case that the air bag is not inflated during a collision because of the occurrence of faults while in operation, it is impossible to sufficiently protect the persons in the vehicle, thereby causing problems of safety. Furthermore, reliability of the air bag equipment is reduced if the air bag would be expanded by faulty operation while the vehicle is running and the expansion of the air bag obstructs the sight of the driver.

Accordingly, there is proposed a diagnosis apparatus for diagnosing faults in air bag equipment in order to prevent occurrence of faulty operation for the purpose of ensuring reliability of the air bag equipment. There is disclosed "FAULT DIAGNOSIS CIRCUIT FOR AIR BAG EQUIPMENT", as a typical example of conventional diagnosis apparatus, which is published in the Japanese official gazette of Patent publication No. 55-45414 (1980).

In the prior art, a diagnosis apparatus for faults of air bag equipment is provided in the diagnosis control unit 55 as shown in FIG. 1A. A diagnosis apparatus 1 comprises, as shown in FIG. 2, a sensor 2 for detecting whether or not the air bag 51 is operated in a normal condition, a fault detection circuit 3 for detecting faults occurring in the sensor 2 and outputting a fault detection signal, a central processing unit (designated as a CPU hereinafter) 4 which receives the fault detection signal detected by a fault detection circuit 3 and determines a fault condition, a fault occurrence position and time registered by a built-in clock, and a memory device 5 for successively storing the fault condition, the fault occurrence position and the time as calculated results of CPU 4.

The diagnosis apparatus 1 is driven by direct current (DC) electric power supplied from a power apparatus 6 which comprises a battery 11 mounted on the vehicle in order to drive the diagnosis apparatus 1. The conventional power apparatus 6, which is applied in the diagnosis apparatus 1 for the air bag equipment, is substantially comprised of only the battery 11, but has no control unit.

The diagnosis apparatus 1 mentioned above, however, has a problem of the battery 11 charge decreasing in the case where much time has elapsed from shipping until the first starting of the engine, and the diagnosis apparatus 1 has operated since shipping because the apparatus 1 has been connected to the loaded battery 11 before the shipping of the vehicle.

Furthermore, if the apparatus 1 is disconnected from the battery 11 between manufacturing and shipping in order to prevent the consumption of the battery 11, there are problems in that dealers may be reluctant to connect the apparatus 1 with the battery 11, and that the reliability of the entire system will deteriorate.

SUMMARY OF THE INVENTION

An object of the present invention is to provide a power supply unit capable of preventing consumption of a battery from the time of shipping of the vehicle to a time of first failure after delivery of the vehicle, and capable of improving reliability in accordance with the air bag diagnosis apparatus, by providing a control unit for switching an electric power supply route, which is connected between the battery and a CPU provided in the diagnosis apparatus and having a built-in clock.

There is provided an apparatus for a diagnosis apparatus for air bag equipment according to the present invention, which comprises a battery circuit for directly supplying electric power from a battery to a CPU having a built-in clock, an ignition switch circuit for supplying the power to the CPU through an ignition switch, a control unit for controlling a power supply line to switch from the ignition switch circuit to the battery circuit by a directional output from the CPU on the basis of battery power supplied through the ignition switch circuit which is closed by starting the engine.

Accordingly, the power unit of this invention does not supply power to the CPU having the built-in clock until a failure occurs, the failure closes the ignition switch circuit to close and supply power to the CPU, the CPU outputs a directional signal which changes the power supply line from the ignition switch circuit to the battery circuit. This changeover operation normally supplies the battery with power to operate the CPU after starting of the engine and counts the time by the built-in clock. As a result, the diagnosis apparatus is capable of diagnosing and storing not only a fault position and condition but also the exact time of a fault occurrence in a memory device when an error occurs in any operating device of the air bag equipment.

As described above, the power unit for the diagnosis apparatus of the air bag equipment according to this invention is capable of preventing the consumption of the battery during the shipping of the vehicle because the diagnosis apparatus is supplied with the power after starting of the engine.

Furthermore, it is possible for the dealers and car repair shops to save physical labor to connect the CPU having the built-in clock with the battery and to improve reliability of the apparatus for diagnosing the air bag equipment.

BRIEF DESCRIPTION OF THE DRAWINGS

FIGS. 1A to 1E are schematic views for explaining one example of an air bag equipment, in which FIG. 1A is a schematically perspective view showing the whole arrangement of the air bag equipment, FIG. 1B is a perspective view showing an inflater of the air bag equipment, FIGS. 1C and 1D are perspective views showing main bodies of the sensor, and FIG. 1E is a circuit diagram showing one example of connections between a battery and sensors;

DETAILED DESCRIPTION OF THE PREFERRED EMBODIMENT

Preferred embodiments of the present invention will become understood from the following detailed description referring to the accompanying drawings.

Figure 2:
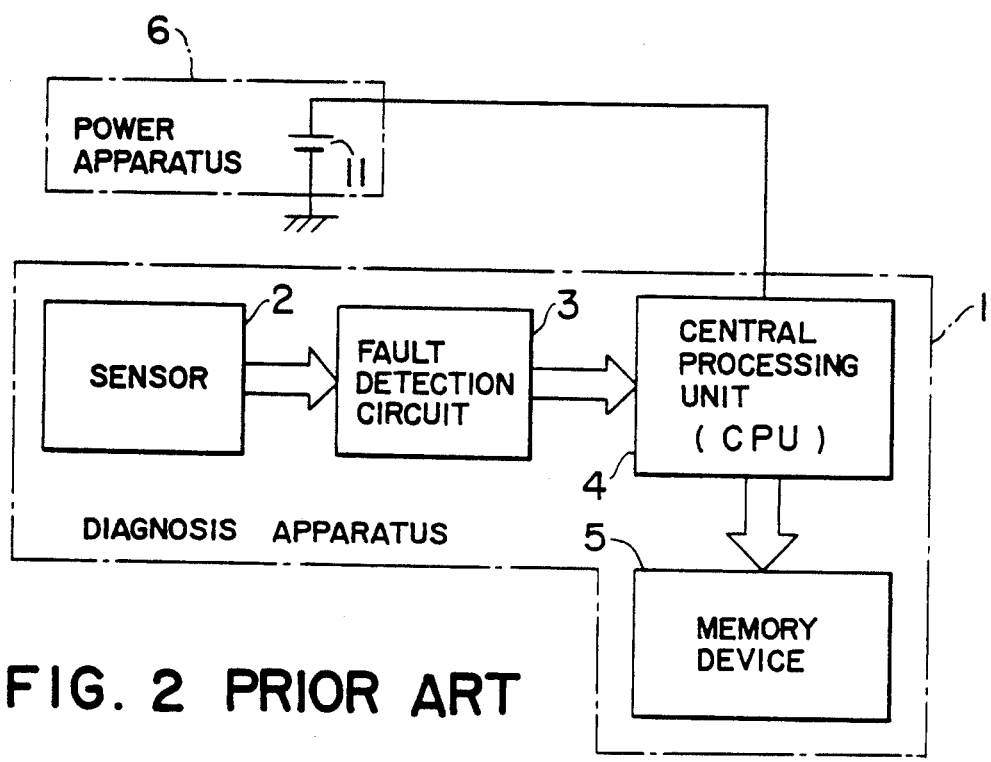
FIG. 2 is a block diagram showing a conventional power apparatus for a diagnosis apparatus for the air bag equipment.
Figure 3:
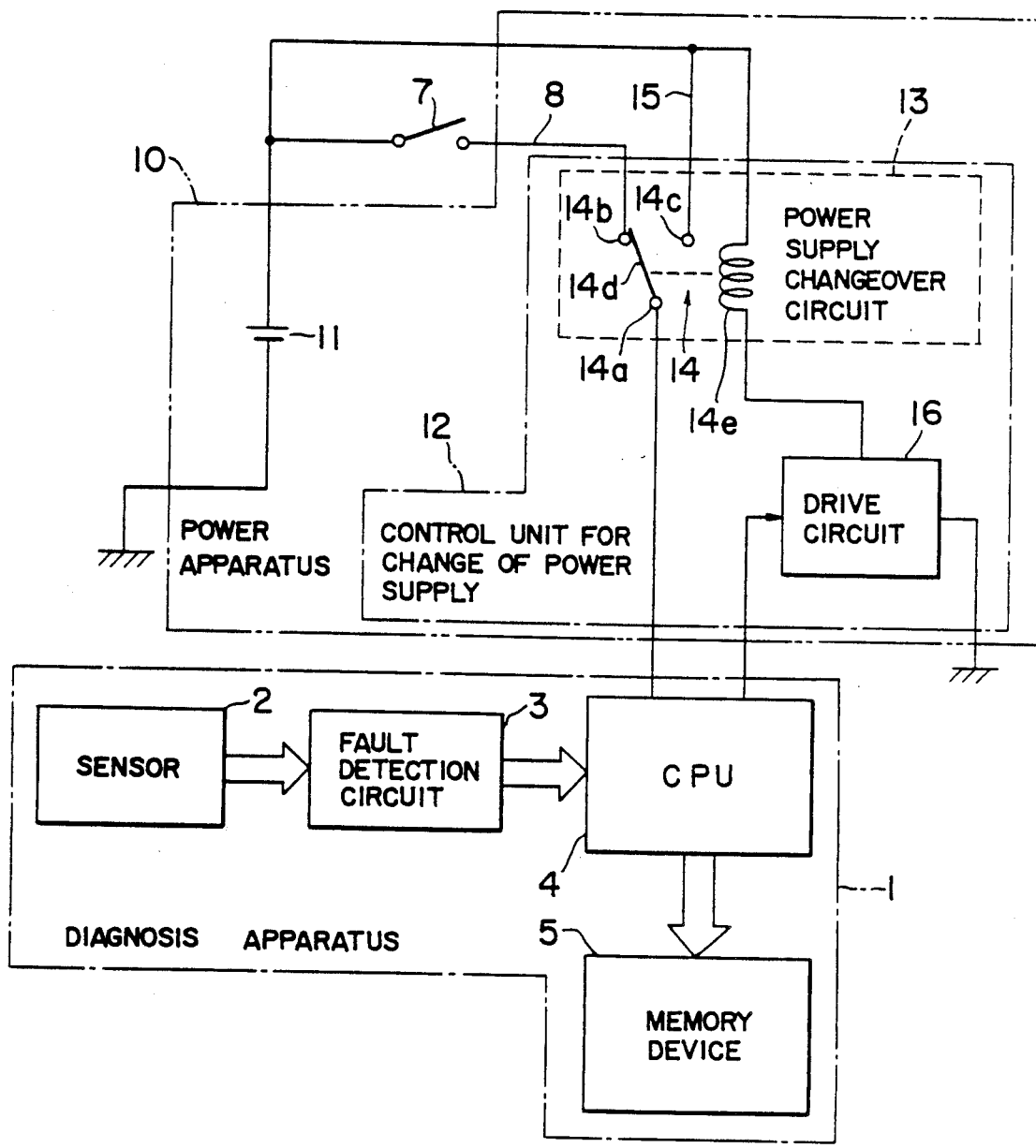
FIG. 3 is a block diagram showing an apparatus for the diagnosis apparatus for the air bag equipment according to the first embodiment of the present invention.

As shown in FIG. 3 for explaining the first embodiment of the present invention, an apparatus 10 of a diagnosis apparatus 1 for diagnosing an air bag equipment comprises a battery 11 mounted on a vehicle, and a control unit 12 for changing a power supply line from the battery 11 to a CPU 4. As the apparatus 10 has the same constitution and function of the conventional one explained in FIG. 2, there will be omitted the repetition of the same description designated by the same numerals in FIG. 3.

An ignition switch 7 as shown in FIG. 3, which is provided on or near the dashboard in front of the driver's seat, on the steering column, or the like.

An ignition switch circuit as shown in FIG. 3 supplies power to the CPU 4. In addition, a battery circuit 15 directly supplies power to the electric devices which need to be able to operate at all times, such as horns and lamps.

The control unit 12 comprises a power supply changeover circuit 13 for changing over a power supply line from the ignition switch circuit to the battery circuit, and a drive circuit 16 for driving the operation of the changeover circuit 13. The changeover circuit 13 consists of a relay 14, which comprises a first fixed contact 14a connected with the CPU 4, a second fixed contact 14b connected with the ignition switch circuit 8, the third fixed contact 14c connected with the battery circuit 15, a movable contact 14d connected to the first fixed contact 14a by its base, and a relay coil 14e. The movable contact 14d is selectively contacted to the second and third fixed contacts 14b and 14c by its tip. The relay coil 14e is connected in parallel to the battery circuit 15 in order to change the power supply from the ignition switch circuit 8 to the battery circuit 15 on the basis of the output from the drive circuit 16 which actuates the movable contact 14d by excitation of the relay coil 14e on the basis of an output signal from the CPU 4.

There will be explained hereinafter an operation of the apparatus 10.

The movable contact 14d of the relay 14 contacts with the second fixed contact 14b before the engine starts for the first time at the dealers or users after the vehicle is delivered from a factory. In this condition, the power of the battery 11 is not supplied to the diagnosis apparatus 1 at all until the circuit 8 becomes a closed circuit when the ignition switch 7 is closed.

Next, when the circuit 8 is closed by closing the ignition switch 7 to start the engine, the power of the battery 11 is supplied with the CPU 4 through the fixed contact 14b, the movable contact 14d and the fixed contact 14a. While the ignition switch 7 is ON, once a failure occurs, the CPU 4 outputs a control signal which changes the power supply line to the drive circuit 16 from the ignition switch circuit 8 to the battery circuit 15.

The circuit changeover operation of the control unit 12 is performed hereinafter on the basis of the control signal output from the CPU 4. Turning off the ignition switch 7 causes the battery 11 to supply the operational power with the CPU 4 and the CPU 4 outputs the signal to the drive circuit 16 if the CPU 4 detects the failure. The drive circuit 16 is made of, for instance, a PNP type transistor having a base electrode which is supplied with the signal as a base voltage. The transistor has a collector electrode which is connected with the positive electrode of the battery 11 through the relay coil 14e, and an emitter electrode which is grounded to the earth. The supply of the base voltage causes the transistor to flow a collector current which excites the relay coil 14e, so that the movable contact 14d separates from the fixed contact 14b and touches contact 14c. The power supply line is changed by the operation of the movable contact 14d from the ignition switch circuit 8 to the battery circuit 15. After that, the fault diagnosis apparatus 1 is activated by the power supplied from the battery 11 through the battery circuit 15 while the failure occurs.

The operation of the CPU 4 for diagnosing the fault is the same as the operation in the conventional apparatus shown in FIG. 2. Namely, the fault detection circuit 3 detects the fault or error which occurs in the sensor 2 such as the squib and outputs the fault detection signal to the CPU 4. The CPU 4 determined the position of occurrence and the time for the fault and a fault condition, and stores the results in the memory device 5. The time measured by the clock circuit (not shown) in the CPU 4, is useful for the calculations for the fault occurrence.

The CPU 4 keeps the drive circuit 16 the relay coil 14e excited even if the engine stops, so that the power for the clock circuit in the CPU 4 is kept supplying through the battery circuit 15. Accordingly, once the clock circuit begins operation, the clock circuit never stops even if the engine stops.

Figure 6:
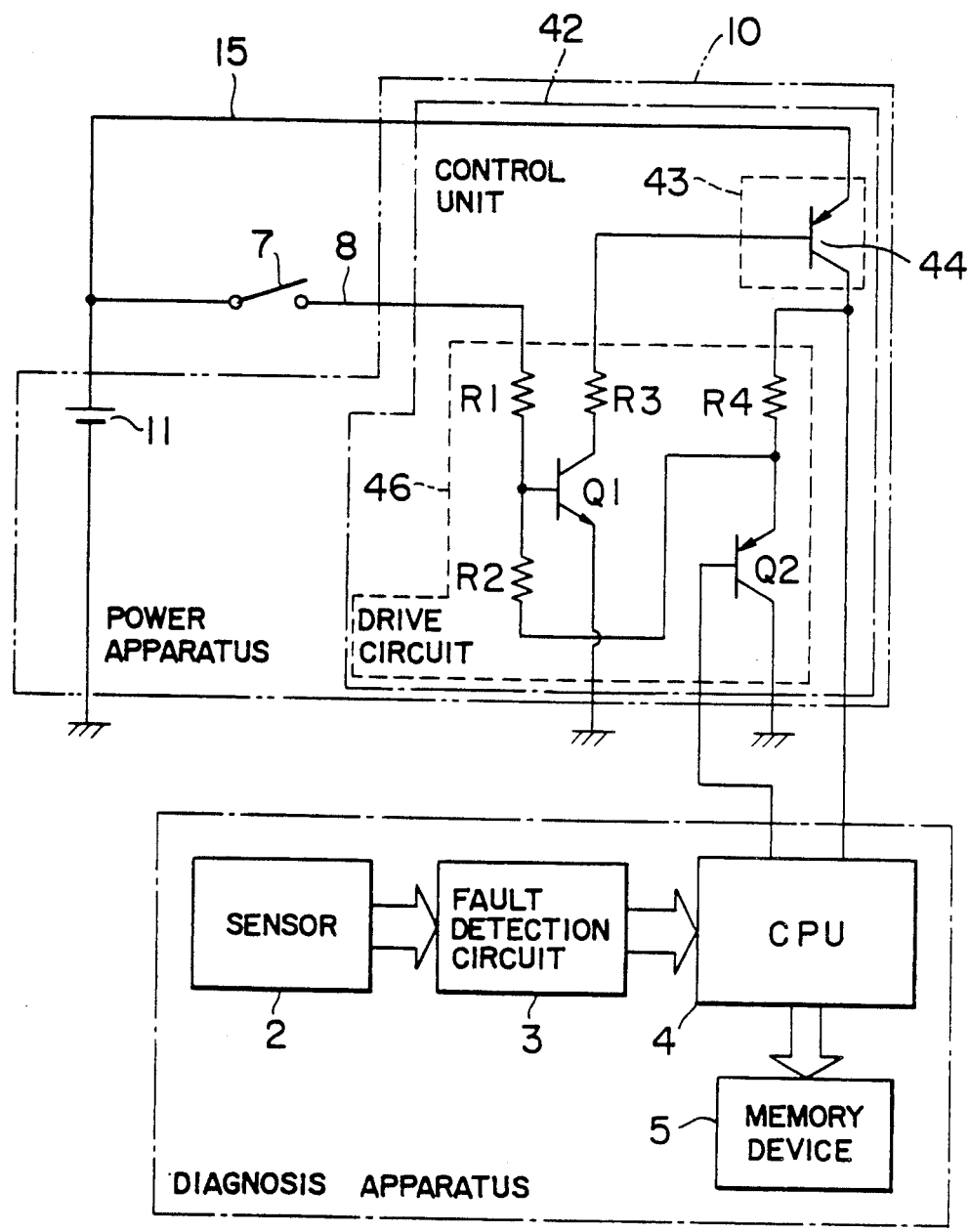
FIG. 6 is a circuit diagram showing an example of a drive circuit of the apparatus according to the present invention.

Though there is explained the first embodiment having a construction in which the drive circuit 16 is made of the NPN type transistor and connected between the relay coil 14e and the CPU 4, this invention is not restricted to the construction of the first embodiment and may be constructed so that the drive circuit 16 is connected between the relay coil 14e and its connection point with the battery circuit 15. And, as another example of the drive circuit 16, it is possible to use a transistor switching circuit 46 shown in FIG. 6. The circuit 46 changes the power supply line from the circuit 8 to the circuit 15 by means of a transistor 44 if failure occurs. Furthermore, the drive circuit 16 may be comprised of other electric devices without the NPN type transistor.

Figure 4:
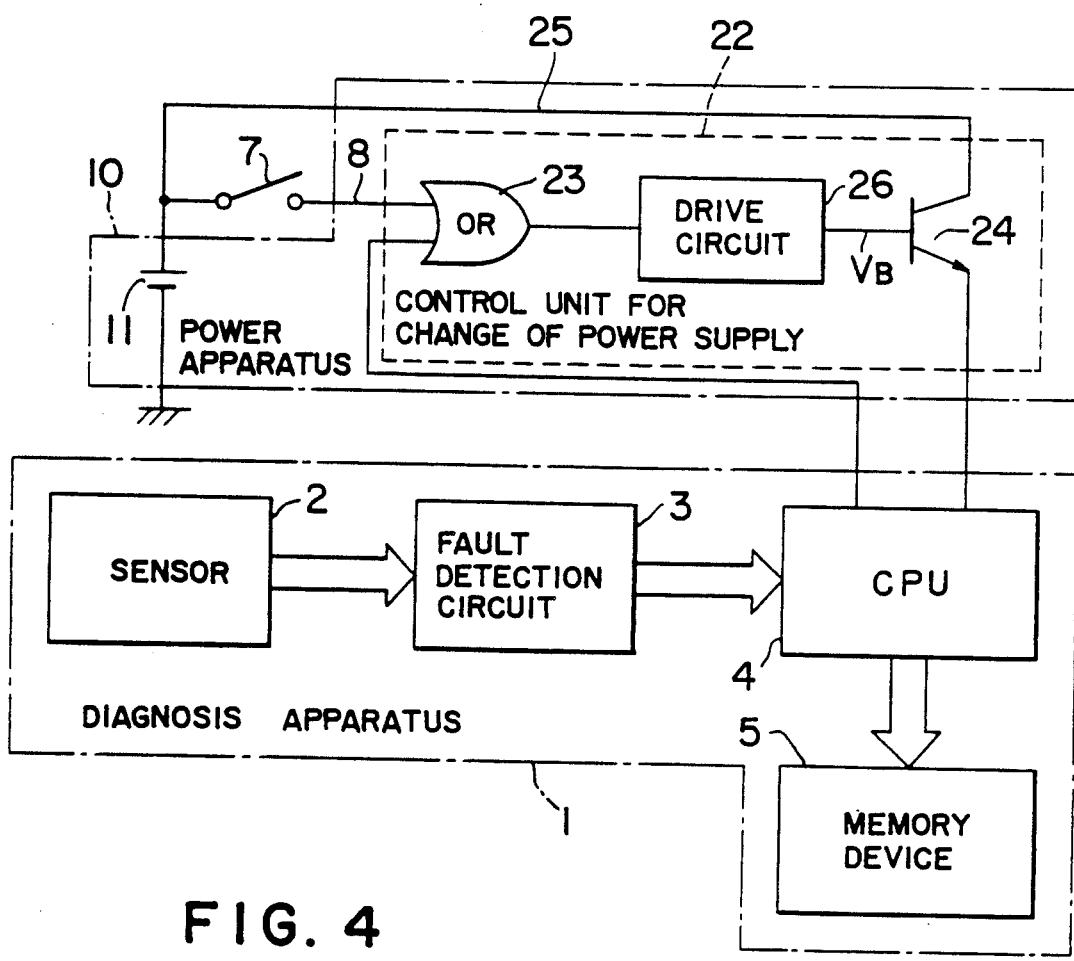
FIG. 4 is a block diagram showing the apparatus for the diagnosis apparatus for the air bag equipment according to the second embodiment of the present invention.

FIG. 4 shows another embodiment of the present invention and indicates the same numerals for the same components of the power apparatus according to the first embodiment. The control unit 22 comprises, as shown in FIG. 4, a logical (designated as an "OR" hereinafter) gate circuit 23 which is connected to the ignition switch 7 by one of input terminals and to the CPU 4 by the other of input terminals, a drive circuit 26 connected with an output terminal of the OR gate circuit 23, and a switching transistor 24 which is connected to a driving output of the drive circuit 26 as a base voltage $V_B$ on its base electrode and connected to the battery 11 on its collector electrode and to the CPU 4 on its emitter electrode, respectively.

There will be explained in operation according to the second embodiment on the basis of the construction mentioned above.

The fault diagnosis apparatus 1 has not been supplied with the power at all before the engine starts at first after the vehicle is transferred to dealers or users. Accordingly, the OR gate circuit 23 has "0" on both the input terminals and output is also "0". Once here the engine starts at the time after delivery, the ignition switch 7 is closed and the OR gate circuit 23 outputs the driving signal to the drive circuit 26 through the ignition switch circuit 8. The drive circuit 26 excites the switching transistor 24 by supplying the base voltage $V_B$ so as to form a battery circuit 25 supplying the power from the battery 11 to the CPU 4 via the switching transistor 24. Accordingly, the CPU 4 including the clock circuit (not shown) is supplied with the battery power as an emitter current of the transistor 24.

The OR gate circuit 23 continues to output the driving signals to the drive circuit 26 if failure occurs, so that the battery circuit 25 continues to supply the CPU 4 with power even if the ignition switch circuit 8 is open.

Figure 5:
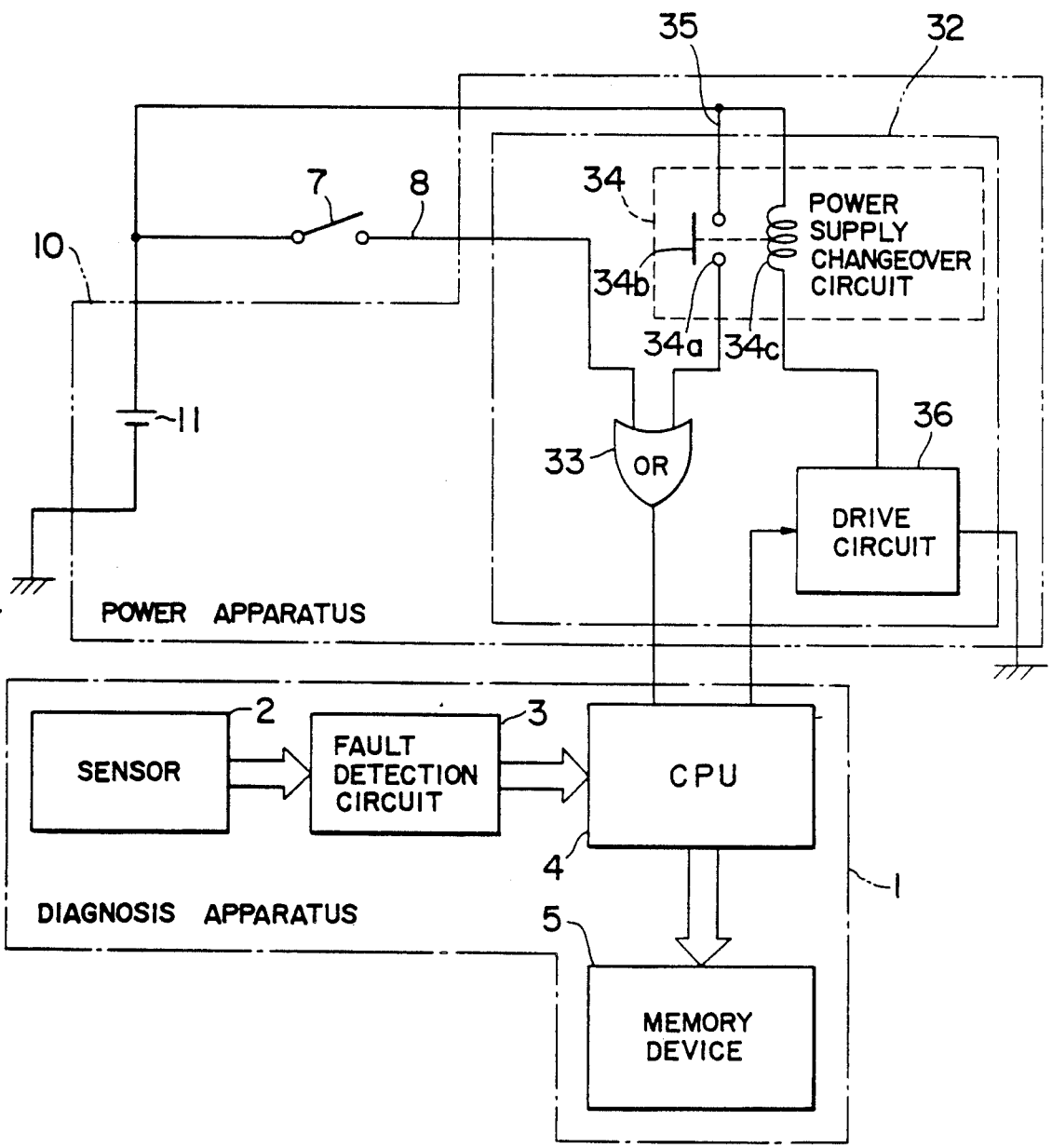
FIG. 5 is a block diagram showing a power apparatus for a diagnosis apparatus for the air bag equipment according to the third embodiment of the present invention.

Now, there will be explained in detail the third embodiment of this invention referring to FIG. 5. FIG. 5 describes the invention in the same way as those in FIGS. 3 and 4. The same numerals indicate the same or equivalent components according to the first and second embodiments.

In FIG. 5, a control circuit 32 in the power apparatus 10 comprises an OR gate circuit 33 which is connected to the ignition switch circuit 8 at an input terminal and to a changeover circuit 34 at the other input terminal. An output terminal of the OR gate circuit 33 is connected to the CPU 4. The changeover circuit 34 is connected between the OR gate circuit 33 and a battery circuit 35. The changeover circuit 34 changes the power supply line from the ignition switch circuit 8 to the battery circuit 35. A drive circuit 36 is connected between the CPU 4 and the changeover circuit 34 and controls driving of the changeover circuit 34. The changeover circuit 34 consists of a relay which comprises a fixed contact 34a, a movable contact 34b, and a relay coil 34c. The relay coil 34c is connected between the drive circuit 36 and a connection point with the battery circuit 35. Then the changeover circuit 34 forms a closed circuit with the battery circuit 35 by the contact of the movable contact 34b to the fixed contact 34a on the basis of excitation of the coil 34c by a driving signal from the drive circuit 36.

The operation will be described on the basis of the construction mentioned above.

The ignition switch circuit 8 is open until the engine starts for the first time after delivery, so that the power is not supplied to the CPU 4 at all because the OR gate circuit 33 outputs the logical "0". The ignition switch circuit 8 becomes a closed circuit when the ignition switch 7 is closed upon starting the engine after delivery, so that the OR gate circuit 33 outputs "1" on the basis of the input "1" which is supplied with one of input terminals of the circuit 33. Accordingly, the CPU 4 obtains the power supplied from the battery 11, which actuate the clock circuit (not shown) and the memory device 5 to perform the predetermined operation.

Furthermore, the CPU 4 outputs the signal to the drive circuit 36 on the basis of power supplied from the battery 11 when failure occurs. If the drive circuit 36 consists of the NPN type transistor the same as the first embodiment, for instance, the transistor is driven by the signal as the base voltage so that the collector current flows in the transistor and the relay coil 34c is excited. This excitation of the coil 34c causes the movable contact 34b to contact with the fixed contact 34a, so that the battery power is supplied with the other input terminal of the OR gate circuit 33 through the battery circuit 35.

Once the OR gate circuit 33 operates and the battery power is supplied, the battery power is kept supplied.

As described above in detail, each embodiment is capable of achieving the desired object of this invention so that the apparatus supplies first the battery power after failure occurs.

As described above, the power unit for the diagnosis apparatus of the air bag fault according to this invention, is capable of preventing consumption of the battery during shipping of the vehicle because the power unit is constructed so that the diagnosis apparatus is supplied with the operational power after failure occurs.

Furthermore, it is possible for the dealers and car repair shops to save physical labor to connect the CPU having the built-in clock with the battery, and it is furthermore possible to improve the reliability of the apparatus for diagnosing air bag faults.

What is claimed is:

1. An apparatus for diagnosing faults in an air bag equipment mounted on a vehicle and having a battery, an ignition key switch connected to the battery, sensing means for sensing the condition for operating the air bag equipment, and fault detection means for detecting a fault occurring in the sensing means and for producing a fault detection signal, comprising:
   a central processing unit for determining a first fault occurrence and for producing a first fault occurrence signal in response to the fault detection signal; and
   control means for applying a power of the battery to said central processing unit in dependency on closing the ignition switch before the faults occur and for maintaining to apply the power of the battery to said central processing unit regardless the conditions of the ignition switch in response to said first fault occurrence signal.

2. The apparatus according to claim 1; further comprising:
   a first line connecting said control means to the central processing unit;
   a second line connecting said control means to the battery through the ignition switch;
   a third line directly connected said control means to the battery in parallel to said second line; and
   a changeover circuit provided in said control means and responsive to said first fault occurrence signal for changing a connecting condition from a connection between said first line and second line to a connection between said first line and third line, so as to supply said central processing unit with said power all the time after said fault occurs.

3. The apparatus according to claim 2, wherein said changeover circuit comprises a relay including a first fixed contact connected with said first line, a second fixed contact connected with said second line, a third fixed contact connected with said third line, a movable contact of which a base end is connected with said first fixed contact and a point end selectively touches said second contact and said third contact, and a relay coil disposed adjacent to said movable contact, and a drive circuit responsive to said first fault occurrence signal for applying current to said relay coil to change the connection of said movable contact from said second contact to said third contact.

4. The apparatus according to claim 1, wherein said control means comprises an OR gate circuit having two input terminals, one of which is connected to the battery through the ignition key switch, and the other of which is connected to said battery through a relay, and an output terminal which is connected to said central processing unit, and a drive circuit for driving said relay to supply the power of the battery to said central processing unit in response to said first fault occurrence signal.

5. The apparatus according to claim 3; wherein said drive circuit comprises an NPN type transistor which is provided between said relay coil and said central processing unit, and
said transistor has a base electrode which is supplied with the first fault occurrence signal as a base voltage from said central processing unit, a collector electrode connected with said relay coil, and an emitter electrode being grounded to an earth.

6. The apparatus according to claim 3; wherein said drive circuit comprises a PNP type transistor which is connected in parallel to said third line between said battery and said relay coil, and
said transistor has a base electrode supplied with a signal as a base voltage from said central processing unit, a collector electrode grounded to an earth, and an emitter electrode connected with said relay coil.

7. The apparatus according to claim 1; wherein said control means comprises a logical OR gate circuit having two input terminals, one of which is connected to said battery through the ignition switch, and the other of which is connected to said central processing unit, a drive circuit for output of driving signal after amplification on the basis of an output of said logical OR gate circuit and a transistor having a base electrode which is supplied with said driving signal from said drive circuit as a base voltage, a collector electrode which is directly connected to said battery, and an emitter electrode which is connected to said central processing unit.

8. The apparatus according to claim 7; wherein said drive circuit comprises a power amplification transistor which generates an output voltage sufficient for said base voltage by amplifying said output of said logical OR gate circuit.

9. The apparatus according to claim 4; wherein said relay comprises a pair of fixed contacts, one of which is connected to the battery, and the other of which is connected to said central processing unit, a movable contact being able to come into and break contact with said fixed contacts, and a relay coil causing said movable contact to contact the fixed contacts on the basis of its excitation by a signal from said drive circuit.

10. The apparatus according to claim 4; wherein said drive circuit comprises an NPN type transistor with a base electrode supplied with said signal from said central processing unit, a collector electrode connected to said relay, and an emitter electrode grounded to an earth.

11. The apparatus according to claim 4; wherein said drive circuit comprises a PNP type transistor with a base electrode supplied with said signal from said central processing unit, a collector electrode grounded to an earth, and an emitter electrode connected to said relay.

* * * * *